United States Patent
Tomiyoshi

(10) Patent No.: US 12,284,896 B2
(45) Date of Patent: Apr. 22, 2025

(54) SEMICONDUCTOR APPARATUS, DISPLAY APPARATUS, PHOTOELECTRIC CONVERSION APPARATUS, ELECTRONIC DEVICE, ILLUMINATION APPARATUS, MOVING OBJECT, AND MANUFACTURING METHOD FOR SEMICONDUCTOR APPARATUS

(71) Applicant: CANON KABUSHIKI KAISHA, Tokyo (JP)

(72) Inventor: Toshio Tomiyoshi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 398 days.

(21) Appl. No.: 17/707,684

(22) Filed: Mar. 29, 2022

(65) Prior Publication Data
US 2022/0320463 A1   Oct. 6, 2022

(30) Foreign Application Priority Data

Mar. 30, 2021   (JP) .................................. 2021-058490

(51) Int. Cl.
*H10K 59/38*   (2023.01)

(52) U.S. Cl.
CPC .................... *H10K 59/38* (2023.02)

(58) Field of Classification Search
CPC .. H10K 59/38; H10K 59/879; H10K 59/8722; H10K 59/123; H10K 59/122
See application file for complete search history.

(56) References Cited

U.S. PATENT DOCUMENTS

| | | | |
|---|---|---|---|
| 2002/0093826 A1* | 7/2002 | Bos | B60Q 3/85 362/135 |
| 2017/0121562 A1* | 5/2017 | Wang | B32B 27/308 |
| 2018/0153054 A1* | 5/2018 | Kim | H10K 59/8722 |
| 2021/0229401 A1* | 7/2021 | Choi | B32B 38/145 |
| 2021/0343970 A1* | 11/2021 | Luo | H10K 71/00 |

FOREIGN PATENT DOCUMENTS

| | | |
|---|---|---|
| JP | 2002025764 A | 1/2002 |
| JP | 2015205784 A | 11/2015 |
| JP | 2020072187 A | 5/2020 |
| JP | 2020537814 A | 12/2020 |
| JP | 2021039846 A | 3/2021 |

* cited by examiner

*Primary Examiner* — Donald L Raleigh
(74) *Attorney, Agent, or Firm* — Canon U.S.A., Inc. I.P. Division

(57) ABSTRACT

A semiconductor apparatus includes a translucent sheet and a semiconductor device that includes an effective pixel area and a peripheral area. A first bonding member is disposed between the peripheral area and the translucent sheet. A second bonding member is disposed between the effective pixel area and the translucent sheet. The first bonding member and the second bonding member are in contact with each other via a first interface. The second bonding member is made of a resin. The second bonding member includes a first part, and a second part disposed between the first part and the first bonding member and in contact with the first bonding member via the first interface. A cure ratio of the second part is lower than a cure ratio of the first part.

19 Claims, 12 Drawing Sheets

SEMICONDUCTOR APPARATUS, DISPLAY APPARATUS, PHOTOELECTRIC CONVERSION APPARATUS, ELECTRONIC DEVICE, ILLUMINATION APPARATUS, MOVING OBJECT, AND MANUFACTURING METHOD FOR SEMICONDUCTOR APPARATUS

BACKGROUND OF THE INVENTION

Field of the Invention

The present disclosure relates to a semiconductor apparatus, a display apparatus, a photoelectric conversion apparatus, an electronic device, an illumination apparatus, a moving object, and a manufacturing method for a semiconductor apparatus.

Description of the Related Art

In a semiconductor apparatus that has an element substrate on which a function element is formed and that performs display or image pickup, a translucent sheet disposed so as to face the element substrate is used to prevent damage to the function element due to external stress. PCT Japanese Translation Patent Publication No. 2020-537814 (hereinafter, PTL 1) describes a packaging method of bonding a TFT substrate that is an element substrate on which an OLED device is formed with a packaging cover that is a translucent sheet. In PTL 1, initially, the element substrate and the translucent sheet are bonded together by applying a frame seal in a peripheral area of the element substrate, and a UV curable sealer is filled in a space surrounded by the element substrate, the translucent sheet, and the frame seal. Then, the sealer is cured by irradiating the sealer with light (UV) via the translucent sheet.

When the element substrate and the translucent sheet are bonded together via the frame seal and then the sealer is filled and cured as in the case of PTL 1, a structure in which the frame seal and the sealer are in contact with each other is obtained.

In such a case, there is an inconvenience that the bonding reliability of the translucent sheet can decrease when, for example, internal stress increases due to heat expansion caused by a temperature change or swelling caused by humidity.

SUMMARY OF THE INVENTION

The present disclosure improves the bonding reliability of a translucent sheet.

An aspect of the present disclosure provides a semiconductor apparatus. The semiconductor apparatus includes a semiconductor device having an effective pixel area with a plurality of effective pixels and a peripheral area around the effective pixel area, a translucent sheet overlapping the effective pixel area and the peripheral area in plan view on a principal surface of the semiconductor device, a first bonding member disposed between the peripheral area and the translucent sheet to bond the semiconductor device with the translucent sheet, and a second bonding member disposed between the effective pixel area and the translucent sheet to bond the semiconductor device with the translucent sheet. The first bonding member and the second bonding member are in contact with each other via a first interface. The second bonding member is made of resin. The second bonding member includes a first part, and a second part disposed between the first part and the first bonding member and in contact with the first bonding member via the first interface. A cure ratio of the second part is lower than a cure ratio of the first part.

Further features of the present invention will become apparent from the following description of exemplary embodiments with reference to the attached drawings.

DESCRIPTION OF THE EMBODIMENTS

Hereinafter, embodiments of the present invention will be described with reference to the attached drawings. In the following description and the drawings, like reference signs are assigned to common components over a plurality of the drawings. Therefore, common components will be described with reference to a plurality of drawings, and the description of components with common reference signs will not be repeated as needed.

In the specification, the words indicating arrangement, such as "up", "down", and the like are used for the sake of convenience to describe the positional relationship among components with reference to the drawings. The positional relationship among components changes as needed in accordance with a direction in which the components are drawn. Therefore, not limited to the words described in the specification, the words may be appropriately replaced depending on situations. The words "up" and "down" do not limit the positional relationship among component elements to directly above or directly below and direct contact. For example, for the expression "member B on member A" does not need to indicate that member B is formed on member A and is in direct contact with member A, and the configuration in which another component element is provided between member A and member B is not excluded.

First Embodiment

Figure 1:
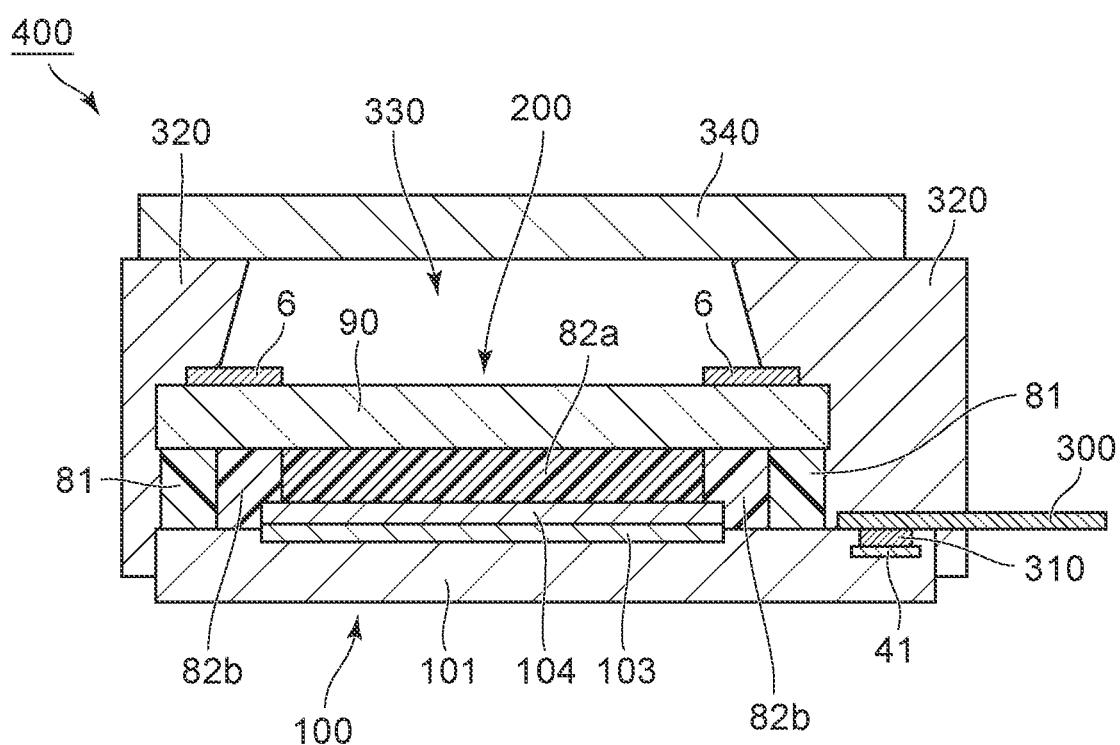
FIG. 1 is a sectional view of a module that includes a semiconductor apparatus according to a first embodiment.

FIG. 1 is a sectional view of a module 400 that includes a semiconductor apparatus 200 according to a first embodiment. The module 400 includes the semiconductor apparatus 200, a flexible wiring board 300, a frame member 320, and a cover plate 340.

The semiconductor apparatus 200 includes a semiconductor device 100, and a translucent sheet 90 disposed so as to face the semiconductor device 100. The semiconductor device 100 and the translucent sheet 90 are bonded by a bonding member 80.

The flexible wiring board 300 is connected to an external connecting terminal 41 of the semiconductor apparatus 200 and is a wiring member used to input an electric power or signal from an external apparatus or output an electric power or signal to an external apparatus. An electrical connecting portion of the external connecting terminal 41 with the flexible wiring board 300 is made up of a conductive member, such as solder and anisotropic conductive film (ACF).

The frame member 320 is a holding member that holds a cover plate 340 and is fixed to the semiconductor apparatus 200. Thus, a space 330 surrounded by the frame member 320 is disposed between the cover plate 340 and the translucent sheet 90.

The semiconductor apparatus 200 of the present embodiment is a display apparatus or an image pickup apparatus. The semiconductor device 100 is a display device or an image pickup device. The module 400 is a display module or an image pickup module.

Figure 2A:
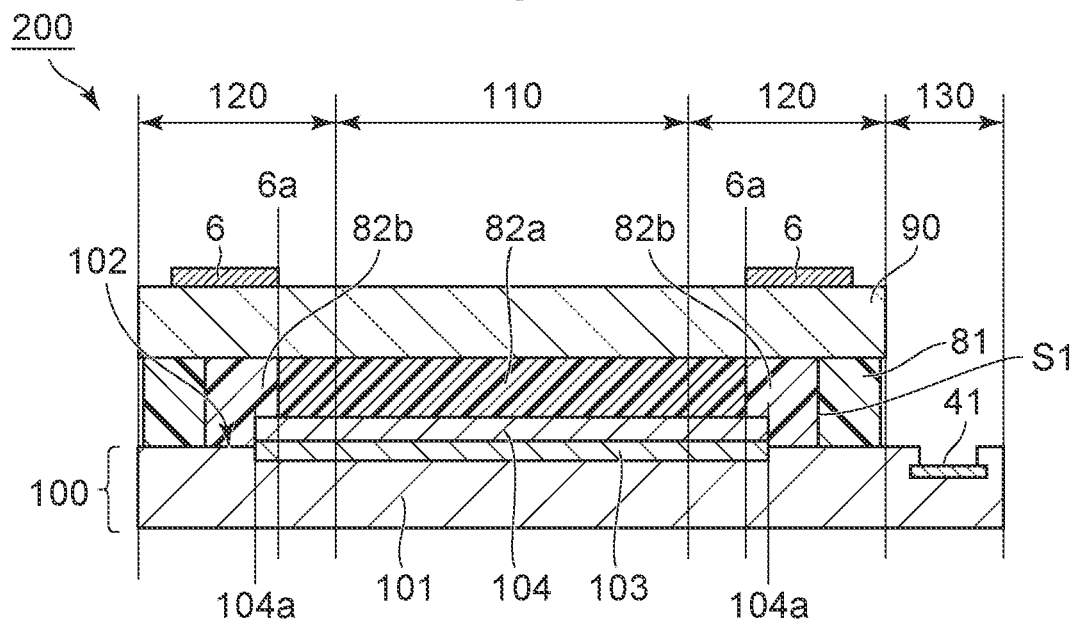
FIG. 2A is a sectional view of the semiconductor apparatus according to the first embodiment.
Figure 2B:
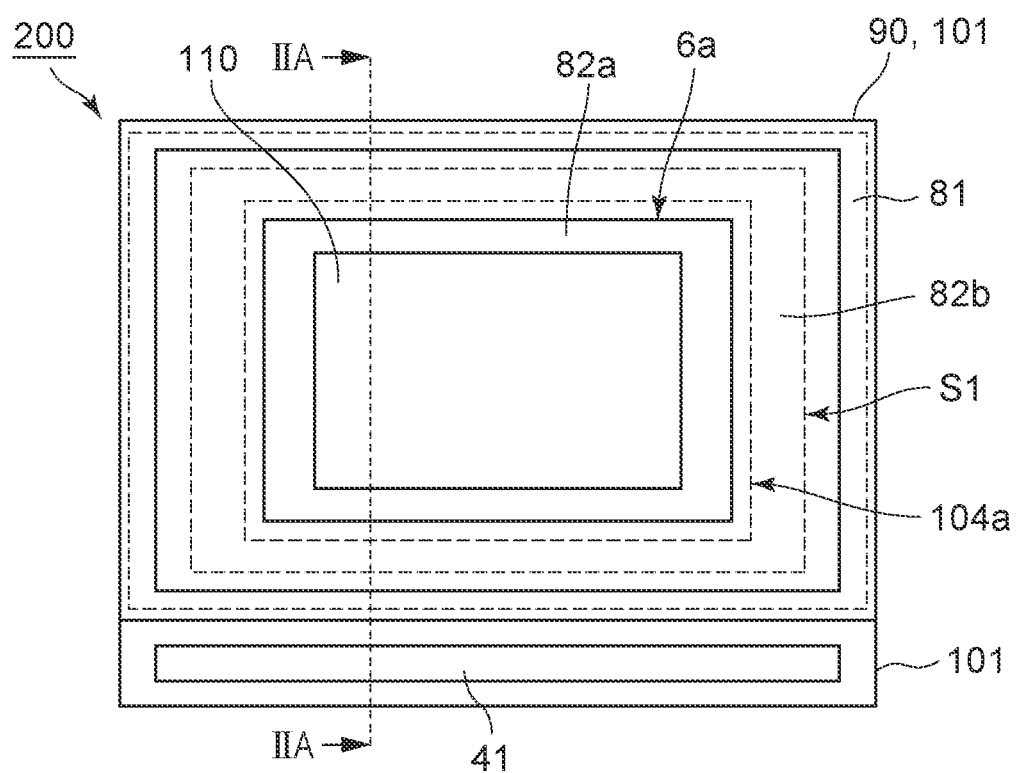
FIG. 2B is a schematic plan view of the semiconductor apparatus according to the first embodiment.

FIG. 2A is a sectional view of the semiconductor apparatus 200 according to the first embodiment. FIG. 2B is a schematic plan view of the semiconductor apparatus 200 according to the first embodiment. FIG. 2A is a sectional view of the semiconductor apparatus 200. FIG. 2B is a plan view of the semiconductor apparatus 200 on the principal surface of the semiconductor device 100. FIG. 2A is a sectional view of the semiconductor apparatus 200, taken along the line IIA-IIA in FIG. 2B. Hereinafter, in illustrating the present embodiment in plan view, the word "inside" indicates the center side of the semiconductor device 100 or opposite substrate, and the word "outside" indicates the edge side of the semiconductor device 100 or translucent sheet 90.

As shown in FIG. 2A, the semiconductor device 100 includes a substrate 101, an effective pixel area 110 on one principal surface 102 side of the substrate 101, and a peripheral area 120 around the effective pixel area 110. In the present embodiment, the peripheral area 120 is disposed so as to surround the effective pixel area 110 in plan view on the principal surface of the semiconductor device 100. In FIG. 2A, the semiconductor device 100 further has a terminal area 130 in which the external connecting terminal 41 is provided. In the present embodiment, the peripheral area 120 is an area around the effective pixel area 110 except the terminal area 130.

The semiconductor device 100 includes a function element 103 disposed on the substrate 101, and a color filter layer 104 that is an optical member disposed on the function element 103. In other words, the semiconductor device 100 has an optical member disposed in the effective pixel area 110 on the side with the translucent sheet 90 (translucent sheet side). The function element 103 is a light-emitting element when the semiconductor device 100 is a light emitting device. The function element 103 is a display element when the semiconductor device 100 is a display device. The function element 103 is a photoelectric conversion element or an image pickup element when the semiconductor device 100 is an image pickup device. At least part of the function element 103 may be formed in the substrate 101. For example, when the function element 103 includes a transistor, the transistor may be a MOS transistor formed in the substrate 101. The substrate 101 may be a semiconductor substrate and may be, for example, a silicon substrate. The display element may be an EL element, may be a liquid crystal element, or may be a reflector element.

A plurality of effective pixels is disposed in the effective pixel area 110, and the effective pixel area 110 functions as a display area when the semiconductor device 100 is a display device and functions as an image pickup area when the semiconductor device 100 is an image pickup device. The effective pixel area 110 has a rectangular shape, and the diagonal length of the effective pixel area 110, for example, ranges from 5 mm to 50 mm.

A peripheral circuit and wiring lines are disposed in the peripheral area 120. When the semiconductor device 100 is a display device, the peripheral circuit includes a drive circuit for driving the effective pixels, and a processing circuit, such as a digital analog conversion circuit (DAC), that processes signals input to the effective pixels. When the semiconductor device 100 is an image pickup device, the peripheral circuit includes a drive circuit for driving the effective pixels, and a processing circuit, such as an analog digital conversion circuit (ADC), that processes signals output from the effective pixels. The peripheral area 120 can include non-effective pixels, such as dummy pixels, reference pixels, test pixels, and monitor pixels, that do not function as effective pixels.

Figure 3:
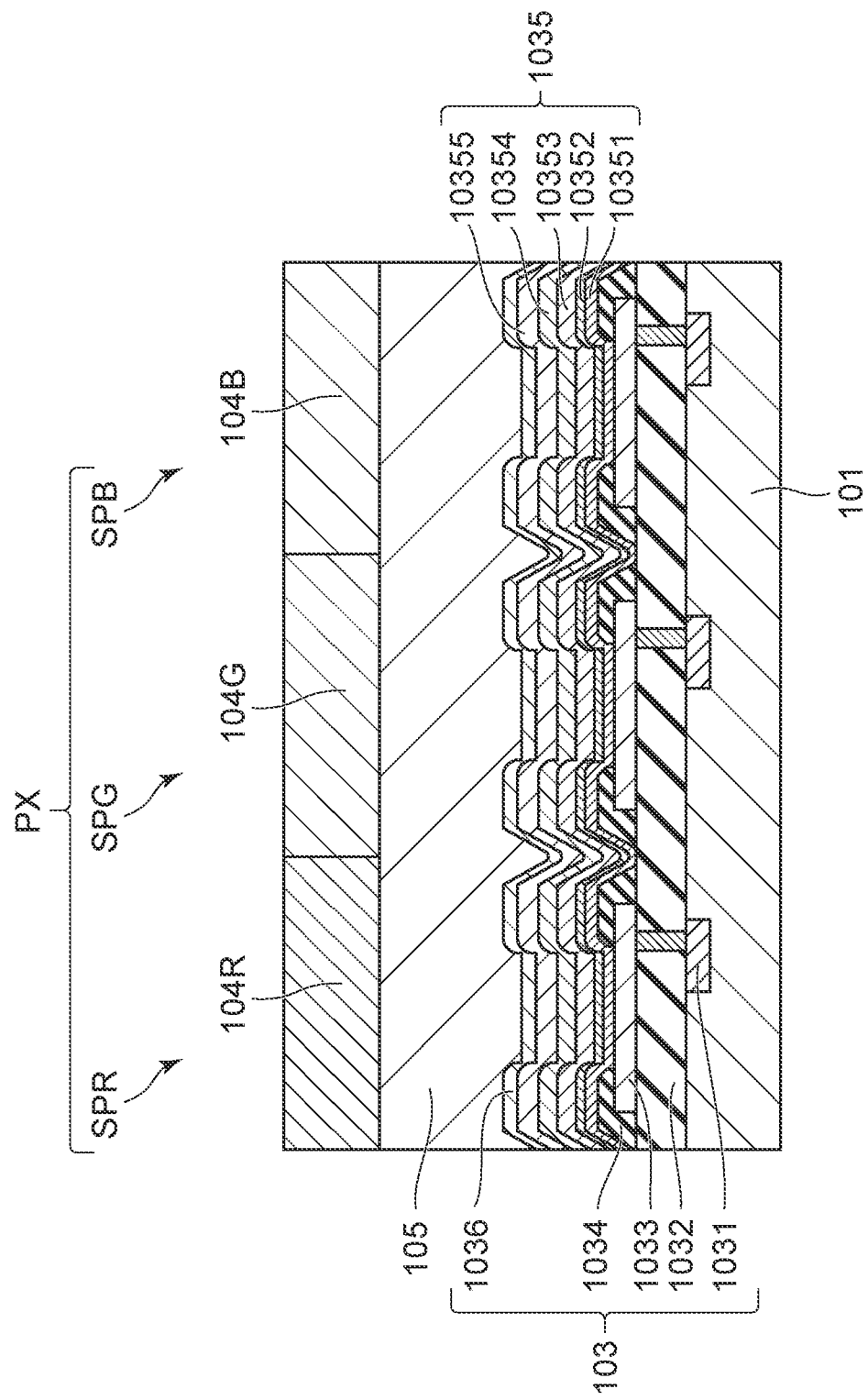
FIG. 3 is a sectional view showing an example of a function element.

Next, an example of the function element 103 will be described with reference to FIG. 3. In the present embodiment, the function element 103 is an organic light emitting element shown in FIG. 3. A plurality of pixels PX is arranged in the effective pixel area 110 in a two-dimensional array in plan view. Each of the pixels PX is made up of a plurality of sub-pixels SP. The sub-pixels SP are classified into a red sub-pixel SPR, a green sub-pixel SPG, and a blue sub-pixel SPB according to light emitted. An emission color may be distinguished by the wavelength of light emitted from a light emitting layer or may be distinguished by the wavelength of light exited by way of selective transmission or color conversion of the color filter layer 104 from light emitted from the light emitting layer.

The function element 103 includes transistors 1031, an interlayer insulating layer 1032, anodes 1033 that are first electrodes, an insulating layer 1034 covering the edges of the first electrodes, an organic compound layer 1035 covering the first electrodes and the insulating layer 1034, and a cathode 1036 that is a second electrode. The color filter layer 104 is disposed on the function element 103, and a protective layer 105 is formed between the function element 103 and the color filter layer 104.

The transistors 1031 are formed on the principal surface 102 of the substrate 101 that is the semiconductor substrate.

In the present embodiment, the substrate 101 is made of silicon, and the transistors 1031 are MOS transistors. The transistors 1031 may be TFTs.

The interlayer insulating layer 1032 is an electrically insulating layer and may be made of a silicon oxide, a silicon nitride, or the like. Contact plugs electrically connected to the transistors 1031 are disposed in the interlayer insulating layer 1032. Conductive members made of tungsten or the like are embedded as the contact plugs. A wiring structure electrically connected to the transistors 1031 via the contact plugs is provided in the interlayer insulating layer 1032. The wiring structure may be a multilayer wiring structure in which a plurality of wiring lines is laminated via an insulating member. A metal member, such as aluminum and copper, may be used as the wiring structure, and a barrier metal, such as Ti, Ta, TiN, and TaN, may be provided at the interface between the wiring structure and the insulating member to reduce diffusion of metal into the insulating member that makes up the interlayer insulating layer 1032. Capacitative elements may be further provided in the interlayer insulating layer 1032. A pixel drive circuit is made up of the transistors 1031, the capacitative elements, the wiring structure, and the like.

The anodes 1033 that are the first electrodes are disposed on the interlayer insulating layer 1032 and are electrically connected to the transistors 1031 via contact holes. The anodes 1033 are separated and individually provided for the sub-pixels SP.

A component material of the anodes 1033 can be the one with a work function that is as large as possible. For example, a metal chemical element, such as gold, platinum, silver, copper, nickel, palladium, cobalt, selenium, vanadium, and tungsten, a mixture containing one or some of these metal chemical elements, an alloy made of a combination of some of these metal chemical elements, or a metal oxide, such as a tin oxide, a zinc oxide, an indium oxide, an indium tin oxide (ITO), and an indium zinc oxide, may be used as the component material. A conductive polymer, such as polyaniline, polypyrrole, and polythiophene, may be used as the component material of the anodes 1033.

One type of these electrode materials may be used solely or two or more types of these electrode materials may be used together. The anodes 1033 each may be made up of one layer or may be made up of a plurality of layers.

When the anodes 1033 are used as reflecting electrodes, for example, chromium, aluminum, silver, titanium, tungsten, molybdenum, an alloy of some of these materials, a laminate of some of these materials, or the like may be used. The above materials may be used to function as a reflection film that does not serve as an electrode. When the anodes 1033 are used as transparent electrodes, a transparent conductive oxide layer, such as an indium tin oxide (ITO) and an indium zinc oxide (IZO), or another conductive layer may be used; however, the material is not limited thereto. Photolithography may be used to form electrodes.

The insulating layer 1034 is also called a bank or a pixel separation film. The insulating layer 1034 covers the edges of the first electrodes and is disposed so as to surround each of the first electrodes. Parts of the upper surfaces of the anodes 1033 where the insulating layer 1034 is not disposed contact with the organic compound layer 1035 and serve as light emission areas. In other words, the light emission areas are defined by the insulating layer 1034.

The organic compound layer 1035 has a hole injection layer 10351, a hole transport layer 10352, a light emitting layer 10353, an electron transport layer 10354, and an electron injection layer 10355. The configuration of the organic compound layer 1035 is not limited. The organic compound layer 1035 may further include a layer other than these layers or does not need to include at least one layer other than the light emitting layer 10353. Each of the layers that make up the organic compound layer 1035 may be made up of a plurality of layers, or the light emitting layer 10353 may include a first light emitting layer and a second light emitting layer.

The cathode 1036 that is the second electrode is disposed on the organic compound layer 1035.

The component material of the cathode 1036 can be the one with a small work function. Examples of the component material of the cathode 1036 include alkali metals, such as lithium, alkaline earth metals, such as calcium, metal chemical elements, such as aluminum, titanium, manganese, silver, lead, and chromium, and mixtures containing one or some of these metal chemical elements. Alternatively, an alloy made of a combination of some of these metal chemical elements may be used as the component material of the cathode 1036. For example, magnesium-silver, aluminum-lithium, aluminum-magnesium, silver-copper, zinc-silver, or the like may be used as the component material of the cathode 1036.

A metal oxide, such as an indium tin oxide (ITO), may also be used as the component material of the cathode 1036. One type of these electrode materials may be used solely or two or more types of these electrode materials may be used together. The cathode 1036 may be made up of a single layer or may be made up of multiple layers. Among others, silver can be used, and a silver alloy can be further used to reduce aggregation of silver. As long as aggregation of silver is reduced, the ratio of an alloy does not matter. For example, the ratio of silver to another metal may be one to one, three to one, or the like.

The cathode 1036 may be made as a top emission element by using an oxide conductive layer made of ITO or the like or may be made as a bottom emission element by using a reflecting electrode made of aluminum (Al) or the like. The arrangement of the cathode 1036 is not limited. A method of forming the cathode 1036 is not limited. When a direct-current and alternating-current sputtering method or the like is used, the film has a good coverage, and it is easy to reduce the resistance, so it is more desirable.

The protective layer 105 reduces penetration of moisture into the organic compound layer 1035. The protective layer 105 is illustrated as one layer and may be a plurality of layers. An inorganic compound layer or an organic compound layer may be provided for each layer. For example, the protective layer 105 may be provided by conveying the cathode 1036 after being formed to another chamber without breaking a vacuum and forming a 2-μm-thick silicon nitride film by CVD. After deposition with CVD, a protective layer using atomic layer deposition (ALD) may be provided.

The material of the film formed by ALD is not limited and may be a silicon nitride, a silicon oxide, an aluminum oxide, or the like. A silicon nitride may be formed by CVD further on the film formed by ALD. The film thickness of the film formed by ALD may be less than the film thickness of the film formed by CVD. Specifically, the film thickness of the film formed by ALD may be less than or equal to 50% of the film thickness of the film formed by CVD and, furthermore, may be less than or equal to 10% of the film thickness of the film formed by CVD.

A planarization layer may be provided on the protective layer 105. The planarization layer is provided for the purpose of reducing the irregularities of the lower layer. The planarization layer may also be called a resin material layer without limiting the purpose. The planarization layer may be made of an organic compound and may be a low-molecular compound or a macromolecular compound. The planarization layer can be a macromolecular compound.

The planarization layer may be provided on the upper and lower sides of the color filter layer 104, and the component materials of those layers may be the same or may be different. Specifically, the planarization layer may be polyvinyl carbazole resin, polycarbonate resin, polyester resin, ABS resin, acrylic resin, polyimide resin, phenolic resin, epoxy resin, silicon resin, urea resin, or the like.

In the present embodiment, the semiconductor device 100 includes the color filter layer 104 disposed on the principal surface 102 side of the substrate 101. The color filter layer 104 is disposed at least on the effective pixel areas 110.

A part disposed on the effective pixel areas 110 of the color filter layer 104 is configured such that a plurality of color filters is arranged in an array. The color filter layer 104 includes a red color filter 104R, a green color filter 104G, and a blue color filter 104B; however, the color filter layer 104 is not limited thereto and may include color filters of other colors, such as cyan, magenta, and yellow. The array of the color filters of the respective colors is a stripe array, a delta array, a Bayer array, or the like and is a delta array in the present embodiment.

The color filter layer 104 may include a part disposed on the peripheral area 120. At this time, a part disposed on the peripheral area 120 of the color filter layer 104 includes a monochromic part that is a part in which a monochromic color filter extends. In addition, a part disposed on the peripheral area 120 of the color filter layer 104 may include a multicolor part that is a part in which color filters of a plurality of colors are arranged in an array. Here, the width of a monochromic color filter in the monochromic part is greater than the width of a monochromic color filter in the part of the color filter layer 104 on the effective pixel area 110 (that is, the width of one sub-pixel). The width of the monochromic color filter in the monochromic part is greater than the width of the monochromic color filter in the multicolor part. One of color filters of a plurality of colors, included in the color filter layer 104, with the shortest absorption wavelength in a visible light range can be used as the color of a monochromic color filter in the monochromic part. Among red (R), green (G), blue (B), cyan, magenta, and yellow, a blue filter can be used for the monochromic part.

The translucent sheet 90 is a sheet-like member having translucency. The translucent sheet 90 is disposed so as to face one principal surface 102 side of the semiconductor device 100 and has a function of protecting the semiconductor device 100. The material of the translucent sheet 90 is not limited and may be glass or rigid resin.

Next, the bonding member 80 that is one feature of the present embodiment will be described. As shown in FIG. 2A, the bonding member 80 includes a first bonding member 81 and a second bonding member 82.

The first bonding member 81 is provided on the peripheral area 120 and is disposed between the peripheral area 120 and the translucent sheet 90. Here, the first bonding member 81 is disposed on the peripheral area 120 so as to surround the effective pixel area 110. The first bonding member 81 has a rectangular frame shape. The first bonding member 81 may continuously surround the effective pixel area 110 or may partially have an opening part through which a space surrounded by the effective pixel area 110 and the translucent sheet 90 communicates with the outside. The shape of the first bonding member 81 in plan view is not limited. The shape of the first bonding member 81 may be a polygonal frame shape as in the case of the present embodiment, may be a circular or elliptical frame shape, or may be a closed, curved frame shape without any corner.

The material of the first bonding member 81 is not limited, and a resin can be used for the first bonding member 81. A resin that makes up the first bonding member 81 is not limited. An acrylic resin, an epoxy resin, an urethane resin, a silicone resin, or the like may be used as the resin, and an epoxy resin can be used as the resin. The first bonding member 81 may further contain a spacer, such as resin beads and silica beads. The first bonding member 81 can be made of a material having a lower permeability (moisture permeability) than the second bonding member 82. Thus, in a high-humidity environment as well, it is possible to suppress an increase in internal stress as a result of swelling of the second bonding member 82 due to entry of moisture into the second bonding member 82. As a result, the bonding reliability of the translucent sheet 90 is improved.

The second bonding member 82 is provided at least on the effective pixel area 110 and is disposed between the effective pixel area 110 and the translucent sheet 90. Here, the second bonding member 82 is also provided on the peripheral area 120 in an area between the first bonding member 81 and the area on the effective pixel area 110. In addition, the outer edge of the second bonding member 82 and the inner edge of the first bonding member 81 are in contact with each other. In other words, the second bonding member 82 is disposed from the effective pixel area 110 to the peripheral area 120 across the boundary between the two areas. The second bonding member 82 is in contact with the first bonding member 81 on the peripheral area 120. When the interface between the first bonding member 81 and the second bonding member 82 is referred to as interface S1, the first bonding member 81 and the second bonding member 82 are regarded as being in contact with each other via the interface S1.

The second bonding member 82 is made of a resin. A resin that makes up the second bonding member 82 is not limited. An acrylic resin, an epoxy resin, an urethane resin, a silicone resin, or the like may be used as the resin, and an acrylic resin can be used as the resin. A resin having a high optical transparency at least in a visible light range wavelength can be used as the resin that makes up the second bonding member 82. To reduce reflection and refraction at the interface with the translucent sheet 90, a material having a small difference in refractive index from the translucent sheet 90 can be used. When glass (refractive index 1.5) is used as the translucent sheet 90, the refractive index of the second bonding member 82 preferably ranges from 1.4 to 1.6 and more preferably ranges from 1.45 to 1.55.

When the first bonding member 81 is made of a resin, the resin that makes up the first bonding member 81 and the resin that makes up the second bonding member 82 may be resins having the same composition or may be resins having different compositions. The first bonding member 81 and the second bonding member 82 can be made of resins having different compositions. In other words, the first bonding member 81 can be made of a first resin, and the second bonding member 82 can be made of a second resin. As described above, the second bonding member 82 needs optical characteristics, such as light transmittance, and the first bonding member 81 needs characteristics, such as strength and low permeability. For this reason, a resin having a composition suitable for each of the members can be used for the member. Even when the first bonding member 81 and the second bonding member 82 are made of resins having the same composition, the interface S1 is formed between the first bonding member 81 and the second bonding member 82 depending on a manner of forming the first bonding member 81 and the second bonding member 82. As will be described below, this is, for example, the case where, after the first bonding member 81 is formed by curing a curable resin, a curable resin is filled inside the first bonding member 81, and the second bonding member 82 is formed by curing the filled curable resin.

The second bonding member 82 has at least a first part 82a disposed on the effective pixel area 110 and a second part 82b disposed on the peripheral area 120 around the first part 82a. Here, the second part 82b is in contact with the first bonding member 81 via the interface S1.

The first part 82a and the second part 82b are respectively made of resins of the same type; however, the resin that makes up the second part 82b is lower in cure ratio than the resin that makes up the first part 82a. Thus, the second part 82b is lower in elasticity modulus than the first part 82a.

Generally, the thermal expansion coefficient of the bonding member 80 differs from the thermal expansion coefficient of the translucent sheet 90 or the thermal expansion coefficient of the semiconductor device 100. When, for example, the bonding member 80 is made of a resin, the bonding member 80 has a thermal expansion coefficient higher by one or two digits than the thermal expansion coefficient of glass or silicon used as the main ingredient of the translucent sheet 90 and the semiconductor device 100. When the bonding member 80 has a higher thermal expansion coefficient than each of the translucent sheet 90 and the semiconductor device 100 or a lower thermal expansion coefficient than each of the translucent sheet 90 and the semiconductor device 100, a volume change due to temperature in the bonding member 80 is different from a volume change due to temperature in each of the translucent sheet 90 and the semiconductor device 100. When, for example, the bonding member 80 has a higher thermal expansion coefficient than each of the translucent sheet 90 and the semiconductor device 100, the volume of the bonding member 80 changes by a larger amount than the volume of each of the translucent sheet 90 and the semiconductor device 100 in the event of a temperature change. As a result, the internal stress of the bonding member 80 increases. As the internal stress of the bonding member 80 increases, a crack or a breakage tends to occur in the interface S1 between the first bonding member 81 and the second bonding member 82 or another part and, therefore, bonding reliability undesirably decreases. This will be remarkable when the thermal expansion coefficient of the first bonding member 81 differs from the thermal expansion coefficient of the second bonding member 82 from a difference in composition between the first bonding member 81 and the second bonding member 82 or other causes.

On the other hand, in the present embodiment, the second bonding member 82 has the first part 82a, and the second part 82b lower in cure ratio than the first part 82a. The second part 82b is in contact with the first bonding member 81 via the interface S1. Thus, even when the internal stress of the bonding member 80 increases, a stress applied to the interface S1 is reduced by the second part 82b with a low cure ratio and a low elasticity modulus.

In this way, the second part 82b functions as a stress reducing portion, so occurrence of a crack or a breakage in the interface S1 is reduced. As a result, the bonding reliability of the translucent sheet 90 is improved.

The cure ratio of the second part 82b is not limited as long as the cure ratio of the second part 82b is lower than the cure ratio of the first part 82a. Where the cure ratio of the first part 82a is one, the cure ratio of the second part 82b may be lower than or equal to 0.95, may be lower than or equal to 0.9, or may be lower than or equal to 0.8. The cure ratio of each of the first part 82a and the second part 82b is able to be calculated in accordance with the peak strength of a polymerizable functional group, such as a vinyl group and an acrylic group, by FT-IR.

As shown in FIG. 2A, the translucent sheet 90 may have a low transmittance layer 6. The low transmittance layer 6 is a layer of which the transmittance of light applied to cure the second bonding member 82 is lower than that of the translucent sheet 90. The low transmittance layer 6 is disposed so as to not overlap the effective pixel area 110 and to overlap the peripheral area 120 in plan view on the principal surface of the semiconductor device 100.

As will be described in detail later, the second bonding member 82 is cured by irradiation with ultraviolet (UV) rays in the present embodiment, so the low transmittance layer 6 is a layer having a lower transmittance of ultraviolet rays than the translucent sheet 90. More specifically, the low transmittance layer 6 in the present embodiment is a layer having a lower transmittance of light with a wavelength of 365 nm than the translucent sheet 90. The low transmittance layer 6 may be a light shielding layer or a light absorbing layer. When light applied to cure the second bonding member 82 is visible light, the low transmittance layer 6 may be a layer having a lower transmittance of light with a visible light wavelength than the translucent sheet 90. Even when the second bonding member 82 is cured by ultraviolet (UV) rays, the low transmittance layer 6 may be a layer having a lower transmittance of ultraviolet rays than the translucent sheet 90, and the low transmittance layer 6 may be a layer having a lower transmittance of light with a visible light wavelength than the translucent sheet 90. When the low transmittance layer 6 is a layer having a low transmittance of light with a visible light wavelength, reflection of light on the surface of the translucent sheet 90 is reduced.

Thus, the quality of display and image pickup of the semiconductor apparatus 200 is improved.

In other words, when the translucent sheet 90 has the low transmittance layer 6, the translucent sheet 90 is also regarded as having a first area in which no low transmittance layer 6 is disposed and a second area in which the low transmittance layer 6 is disposed. The second area is an area having a lower transmittance of light applied to cure the second bonding member 82 than the first area. In plan view on the principal surface of the semiconductor device 100, the first area is disposed so as to overlap the effective pixel area 110, and the second area is disposed so as to overlap the peripheral area 120.

As shown in FIG. 2A, the low transmittance layer 6 can be disposed on the surface of the translucent sheet 90 on the side opposite to the surface facing the semiconductor device 100. As shown in FIG. 2B, the low transmittance layer 6 is disposed so as to surround the effective pixel area 110 in plan view on the principal surface of the semiconductor device 100. The first part 82a of the second bonding member 82 may be a part of the second bonding member 82, disposed on the effective pixel area 110. The second part 82b may be a part of the second bonding member 82, disposed under the low transmittance layer 6. In plan view on the principal surface of the semiconductor device 100, the inner edge 6a of the low transmittance layer 6 can coincide with the inner edge of the second part 82b of the second bonding member 82. In plan view on the principal surface of the semiconductor device 100, the interface S1 can overlap the low transmittance layer 6. As will be described later, the first part 82*a* and the second part 82*b* can be easily formed by applying light via the low transmittance layer 6 and the translucent sheet 90 to a composition for forming the second bonding member 82 applied on the semiconductor device 100.

As shown in FIG. 2B, the second part 82*b* is disposed so as to cover the edge 104*a* of the color filter layer 104. At the edge 104*a* of the color filter layer 104, there is a step on the surface of the semiconductor device 100. As described above, generally, the thermal expansion coefficient of the bonding member 80 differs from the thermal expansion coefficient of the translucent sheet 90 and the thermal expansion coefficient of the semiconductor device 100, so the internal stress of the bonding member 80 increases due to a temperature change. As the internal stress of the bonding member 80 increases, a stress in a part that covers such a step tends to concentrate, and a crack or a breakage tends to occur, with the result that bonding reliability undesirably decreases. Therefore, in the present embodiment, the second part 82*b* having a low cure ratio and a low elasticity modulus is disposed at the step where a stress tends to occur in this way. The second part 82*b* is lower in elasticity modulus than the other part of the bonding member 80, including the first part 82*a* and the like, so occurrence of a crack or a breakage due to stress concentration is reduced. As a result, the bonding reliability is improved.

The edge 104*a* of the color filter layer 104 is covered with the second part 82*b* since the color filter layer 104 provides a particularly large step in the present embodiment; however, the configuration is not limited thereto. In one cross section, the second part 82*b* can be disposed so as to cover the step having the largest difference in level from the outer edge of the effective pixel area 110 to the inner edge of the first bonding member 81. For example, in a configuration in which the microlens array layer that is an optical member on the color filter layer 104 and a step is also formed at the edge of the microlens array layer, the second part 82*b* can be disposed so as to cover the edge of the microlens array layer.

Manufacturing Method for Semiconductor Apparatus

Next, a manufacturing method for the semiconductor apparatus 200 according to the present embodiment will be described with reference to FIGS. 4A to 4F. FIGS. 4A to 4F are schematic diagrams illustrating the manufacturing method for the semiconductor apparatus 200 according to the first embodiment.

Figure 4A:
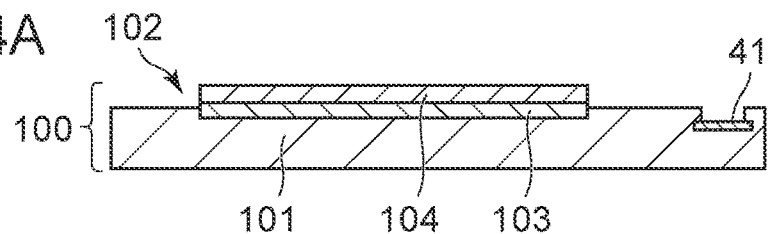
FIGS. 4A to 4F are schematic diagrams illustrating a manufacturing method for the semiconductor apparatus according to the first embodiment.

As shown in FIG. 4A, the function element 103 and the color filter layer 104 are formed on at least the effective pixel area 110 of the substrate 101. Here, the function element 103 is formed not only on the effective pixel area 110 but also on part of the peripheral area 120. However, the configuration is not limited thereto. At least part of the function element 103 may be formed all over the peripheral area 120. In the present embodiment, the interlayer insulating layer 1032 that makes up the function element 103 is formed all over the peripheral area 120. The protective layer 105 is also formed all over the peripheral area 120. In other words, the interlayer insulating layer 1032 and the protective layer 105 are provided so as to extend to outside the organic compound layer 1035 in plan view on one principal surface 102 of the substrate 101. Thus, entry of moisture to the organic compound layer 1035 is effectively prevented, with the result that the life of the function element 103 is extended.

Figure 4B:
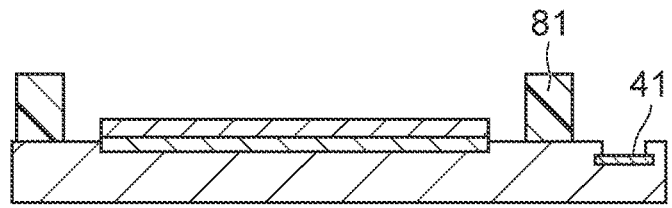

Subsequently, as shown in FIG. 4B, the first bonding member 81 is formed on the peripheral area 120 of the substrate 101 (first bonding member forming step). In the present embodiment, the first bonding member 81 is made of a resin, and a first curable composition for forming the first bonding member 81 is applied and formed by a method, such as dispensing, screen printing, and flexographic printing. After the first curable composition is applied, the first curable composition is cured by UV irradiation or heating, with the result that the first bonding member 81 is formed. The first bonding member 81 does not need to be cured in this step. The first bonding member 81 may be cured at the same time in a step of curing the second bonding member 82 as will be described later. Alternatively, the first bonding member 81 may be partially or lightly cured in this step, and the first bonding member 81 may be further cured in a step of curing the second bonding member 82.

Figure 4C:
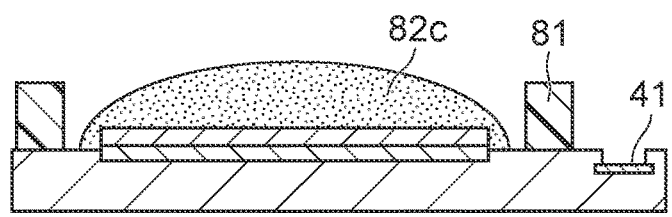

After that, as shown in FIG. 4C, a second curable composition 82*c* that is a composition for forming the second bonding member 82 made of a resin is applied to an area defined by the first bonding member 81 on one principal surface 102 of the substrate 101 and including the effective pixel area 110. The second curable composition 82*c* is a photo-curable composition. An adequate amount of the second curable composition 82*c* is applied by dispensing. Here, the adequate amount means a quantity to such an extent that the second curable composition 82*c* spreads to wet to near the inner edge of the first bonding member 81 in a step of bonding the translucent sheet 90 (described later) and the second curable composition 82*c* does not squeeze out to the outside of the first bonding member 81.

Figure 4D:
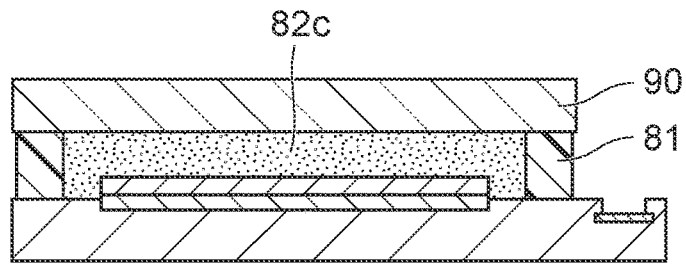

Subsequently, as shown in FIG. 4D, the translucent sheet 90 is bonded so as to face one principal surface 102 of the substrate 101 (bonding step). By bonding the translucent sheet 90, the second curable composition 82*c* applied on the substrate 101 is pushed to spread, and the space surrounded by the first bonding member 81, the semiconductor device 100, and the translucent sheet 90 is filled with the second curable composition 82*c*. The step of bonding the substrate 101 and the translucent sheet 90 with each other can be performed in a vacuum or low-pressure environment to prevent inclusion of a foreign substance or a bubble in the second curable composition 82*c*.

Figure 4E:
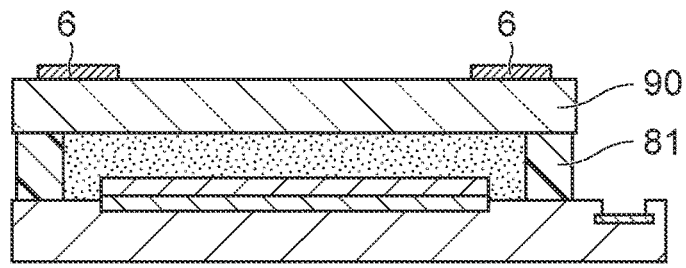

Then, as shown in FIG. 4E, the low transmittance layer 6 is formed on the translucent sheet 90. The low transmittance layer 6 may be applied and formed on the translucent sheet 90 or may be formed by patterning after being applied. Alternatively, the patterned low transmittance layer 6 may be bonded to be formed on the translucent sheet 90. Here, the translucent sheet 90 is bonded to the substrate 101 and then the low transmittance layer 6 is formed; however, the configuration is not limited thereto. The translucent sheet 90 on which the low transmittance layer 6 is formed in advance may be bonded to the substrate 101. The low transmittance layer 6 is formed so as to cover the inner edge of the first bonding member 81 in plan view on one principal surface 102 of the substrate 101. In other words, the low transmittance layer 6 is formed so as to cover the interface between the first bonding member 81 and the second curable composition 82*c* in plan view on one principal surface 102 of the substrate 101. In the translucent sheet 90, the area that overlaps the low transmittance layer 6 is a first area, and the area that does not overlap the low transmittance layer 6 is a second area.

Subsequently, ultraviolet rays (UV rays) are applied via the low transmittance layer 6 from the surface of the translucent sheet 90 on the side opposite to the substrate 101 (photo-irradiation step). Here, UV rays are applied in the direction normal to one principal surface 102 of the substrate 101. At this time, light applied to a part of the second curable composition 82*c*, overlapping the low transmittance layer 6, is less or weaker than that applied to a part not overlapping the low transmittance layer 6. In other words, light applied to a part of the second curable composition 82c, overlapping the second area, is less or weaker than light applied to a part overlapping the first area.

Thus, a part of the second curable composition 82c, covered with the low transmittance layer 6, is lower in cure ratio than a non-covered part.

Figure 4F:
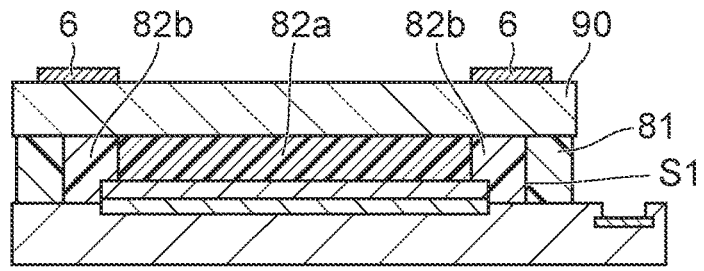

In the photo-irradiation step according to the present embodiment, as described above, light is applied to the second curable composition 82c in a state where the first area of the translucent sheet 90 overlaps the effective pixel area 110 and the second area of the translucent sheet 90 overlaps the interface between the first bonding member 81 and the second curable composition 82c. As a result, as shown in FIG. 4F, the second bonding member 82 obtained by curing the second curable composition 82c includes the first part 82a and the second part 82b that are different in cure ratio. The second part 82b is a part lower in cure ratio than the first part 82a and lower in elasticity modulus than the first part 82a. The second part 82b that is a part lower in elasticity modulus makes up the interface S1 between the first bonding member 81 and the second bonding member 82. With this configuration, as described above, occurrence of a crack or a breakage in the interface S1 is reduced, with the result that the bonding reliability of the translucent sheet 90 is improved.

Second Embodiment

Figure 5A:
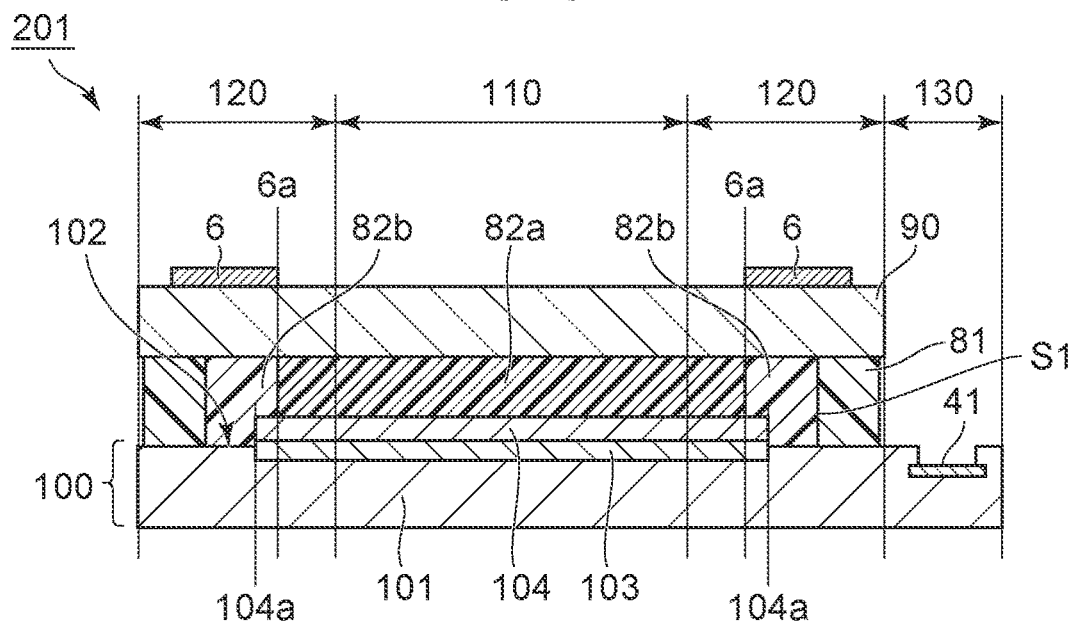
FIG. 5A is a sectional view of a semiconductor apparatus according to a second embodiment.
Figure 5B:
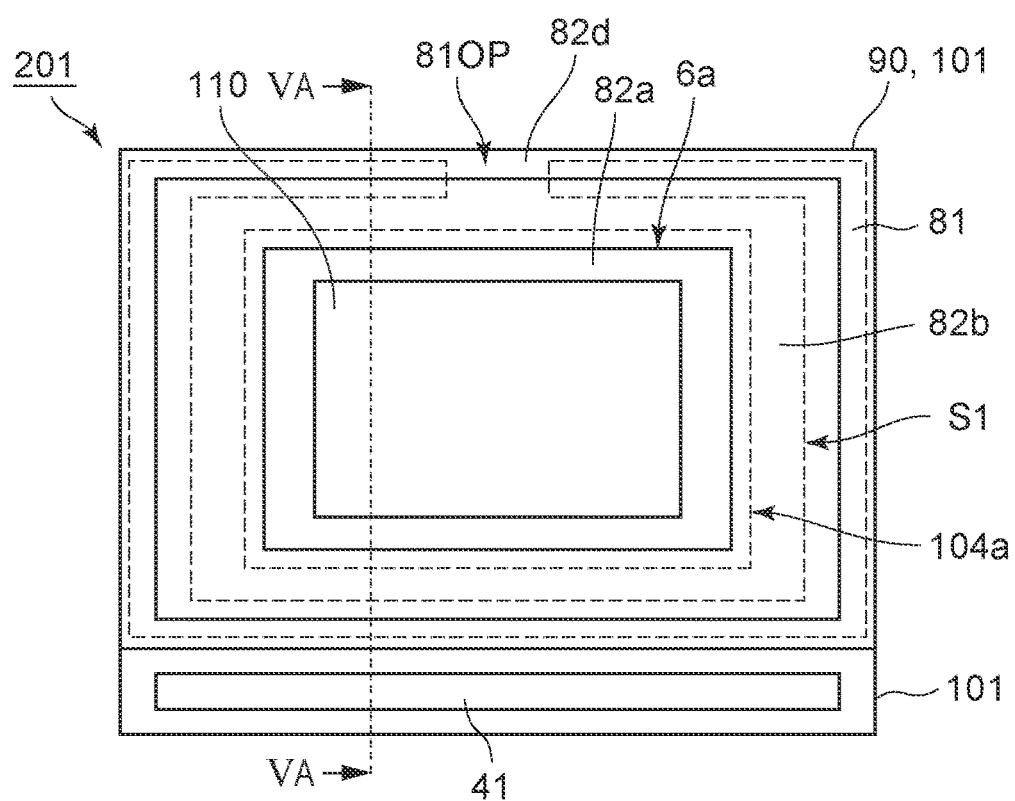
FIG. 5B is a schematic plan view of the semiconductor apparatus according to the second embodiment.

FIG. 5A is a sectional view of a semiconductor apparatus 201 according to a second embodiment. FIG. 5B is a schematic plan view of the semiconductor apparatus 201 according to the second embodiment. FIG. 5A is a sectional view of the semiconductor apparatus 201. FIG. 2B is a plan view of the semiconductor apparatus 201 on the principal surface of the semiconductor device 100. FIG. 5A is a sectional view of the semiconductor apparatus 201, taken along the line VA-VA in FIG. 5B. Hereinafter, the description of portions common to those of the first embodiment will not be repeated.

The semiconductor apparatus 201 according to the second embodiment differs from the semiconductor apparatus 200 according to the first bonding member in the arrangement and formation method of the first bonding member 81 and the second bonding member 82. In the first embodiment, the first bonding member 81 is disposed so as to endlessly surround the effective pixel area 110. On the other hand, in the present embodiment, as shown in FIG. 5B, the first bonding member 81 represented by dashed lines has an opening part 81OP. The opening part 81OP is a part via which the space surrounded by the semiconductor device 100, the translucent sheet 90, and the first bonding member 81 communicates with the external space. The low transmittance layer 6 is provided so as to partially cover the opening part 81OP in plan view on one principal surface 102 of the substrate 101.

The second bonding member 82 is disposed in the opening part 81OP, the second part 82b of the second bonding member 82 is disposed at a part of the opening part 81OP, close to the effective pixel area 110, and a third part 82d of the second bonding member 82 is disposed at a part far from the effective pixel area 110. The second part 82b is a part lower in cure ratio than the third part 82d.

When the first bonding member 81 has the opening part 81OP as in the case of the present embodiment, the opening part 81OP can be an entry path for moisture, so a bonding member lower in moisture permeability can be disposed at the opening part 81OP. Therefore, as in the case of the present embodiment, the third part 82d having a high cure ratio can be disposed at the opening part 81OP. However, as the internal stress of a part of the second bonding member 82, disposed on the effective pixel area 110, increases due to a temperature change, a stress tends to concentrate on a part not surrounded by the first bonding member 81, that is, the opening part 81OP.

As a result, a stress concentrates on the third part 82d disposed at the opening part 81OP, with the result that a crack or a breakage tends to occur. On the other hand, in the present embodiment, the second part 82b lower in cure ratio than the third part 82d is disposed inside the opening part 81OP between the third part 82d and the effective pixel area 110. In this way, by disposing the second part 82b having a low cure ratio and a low elasticity modulus, a stress applied to the third part 82d is reduced. In this way, the second part 82b functions as a stress reducing portion, so occurrence of a crack or a breakage in the opening part 81OP is reduced. As a result, the bonding reliability of the translucent sheet 90 is improved.

Manufacturing Method for Semiconductor Apparatus

Next, a manufacturing method for the semiconductor apparatus 201 according to the second embodiment will be described with reference to FIGS. 6A to 6F. FIGS. 6A to 6F are schematic diagrams illustrating the manufacturing method for the semiconductor apparatus 201 according to the second embodiment. The description of portions common to those of the first embodiment is simplified.

Figure 6A:
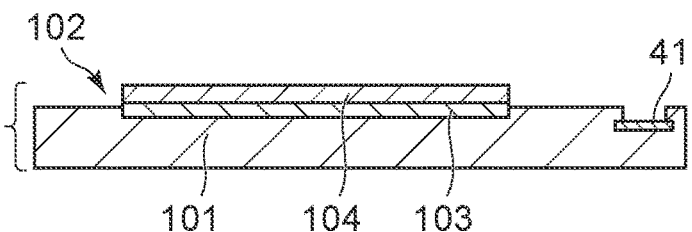
FIGS. 6A to 6F are schematic diagrams illustrating a manufacturing method for the semiconductor apparatus according to the second embodiment.

As shown in FIG. 6A, the function element 103 and the color filter layer 104 are formed on at least the effective pixel area 110 of the substrate 101.

Figure 6B:
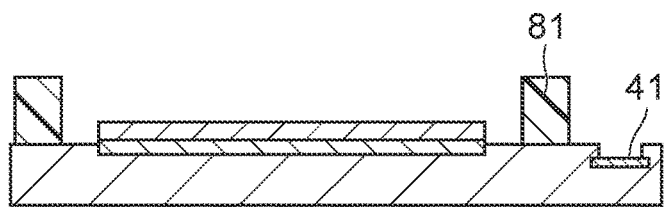

Subsequently, as shown in FIG. 6B, the first bonding member 81 is formed on the peripheral area 120 of the substrate 101. At this time, the first bonding member 81 is formed so as to have the opening part 81OP outside the effective pixel area 110 (first bonding member forming step).

Figure 6C:
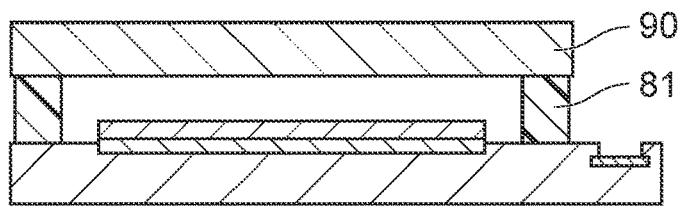

Subsequently, as shown in FIG. 6C, the translucent sheet 90 is bonded so as to face one principal surface 102 of the substrate 101 (bonding step). The first bonding member 81 may be further cured after bonding the translucent sheet 90 to the substrate 101.

Figure 6D:
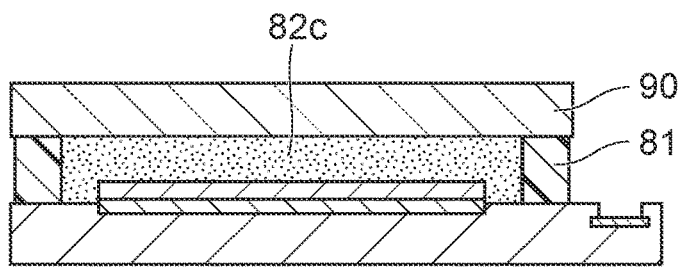

After that, as shown in FIG. 6D, the second curable composition 82c is injected from the opening part 81OP, and the second curable composition 82c is filled in the opening part 81OP and the space formed by the semiconductor device 100, the translucent sheet 90, and the first bonding member 81.

Figure 6E:
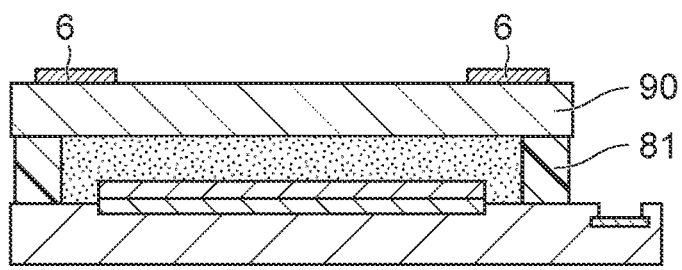

Then, as shown in FIG. 6E, the low transmittance layer 6 is formed on the translucent sheet 90. The low transmittance layer 6 is formed so as to cover the inner edge of the first bonding member 81 in plan view on one principal surface 102 of the substrate 101. At the opening part 81OP of the first bonding member 81, the low transmittance layer 6 is formed so as to cover at least part of the opening part 81OP. Here, the low transmittance layer 6 is formed so as to partially cover the opening part 81OP on the side close to the effective pixel area 110. In the translucent sheet 90, the area that overlaps the low transmittance layer 6 is a first area, and the area that does not overlap the low transmittance layer 6 is a second area.

Subsequently, ultraviolet rays (UV rays) are applied via the low transmittance layer 6 from the surface of the translucent sheet 90 on the side opposite to the substrate 101 (photo-irradiation step). Here, UV rays are applied in the direction normal to one principal surface 102 of the substrate 101. At this time, light applied to a part of the second curable composition 82c, overlapping the low transmittance layer 6, is less or weaker than that applied to a part not overlapping the low transmittance layer 6. In other words, light applied to a part of the second curable composition 82c, overlapping the second area, is less or weaker than light applied to a part overlapping the first area. Thus, a part of the second curable composition 82c, covered with the low transmittance layer 6, is lower in cure ratio than a non-covered part.

Figure 6F:
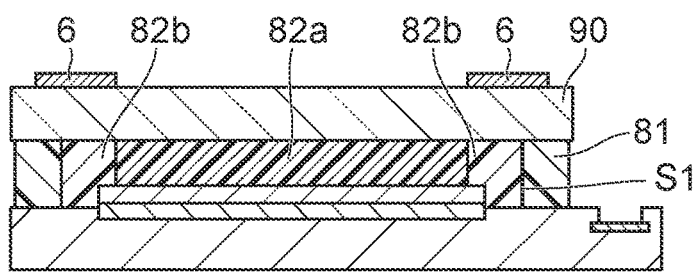

As a result, as shown in FIGS. 6F and 5B, the second bonding member 82 obtained by curing the second curable composition 82c includes the first part 82a, the second part 82b, and the third part 82d that are different in cure ratio. The second part 82b is a part lower in cure ratio than the first part 82a and the third part 82d and lower in elasticity modulus than the first part 82a and the third part 82d. The cure ratio of the first part 82a and the cure ratio of the third part 82d may be the same, or the cure ratio of the third part 82d may be higher than the cure ratio of the first part 82a. The second part 82b that is a part lower in elasticity modulus makes up the interface S1 between the first bonding member 81 and the second bonding member 82. In addition, the second part 82b that is a part having a low elasticity modulus is disposed at a part of the opening part 81OP, close to the effective pixel area 110. With this configuration, as described above, occurrence of a crack or a breakage in the interface S1 or the opening part 81OP is reduced, with the result that the bonding reliability of the translucent sheet 90 is improved.

Third Embodiment

Figure 7:
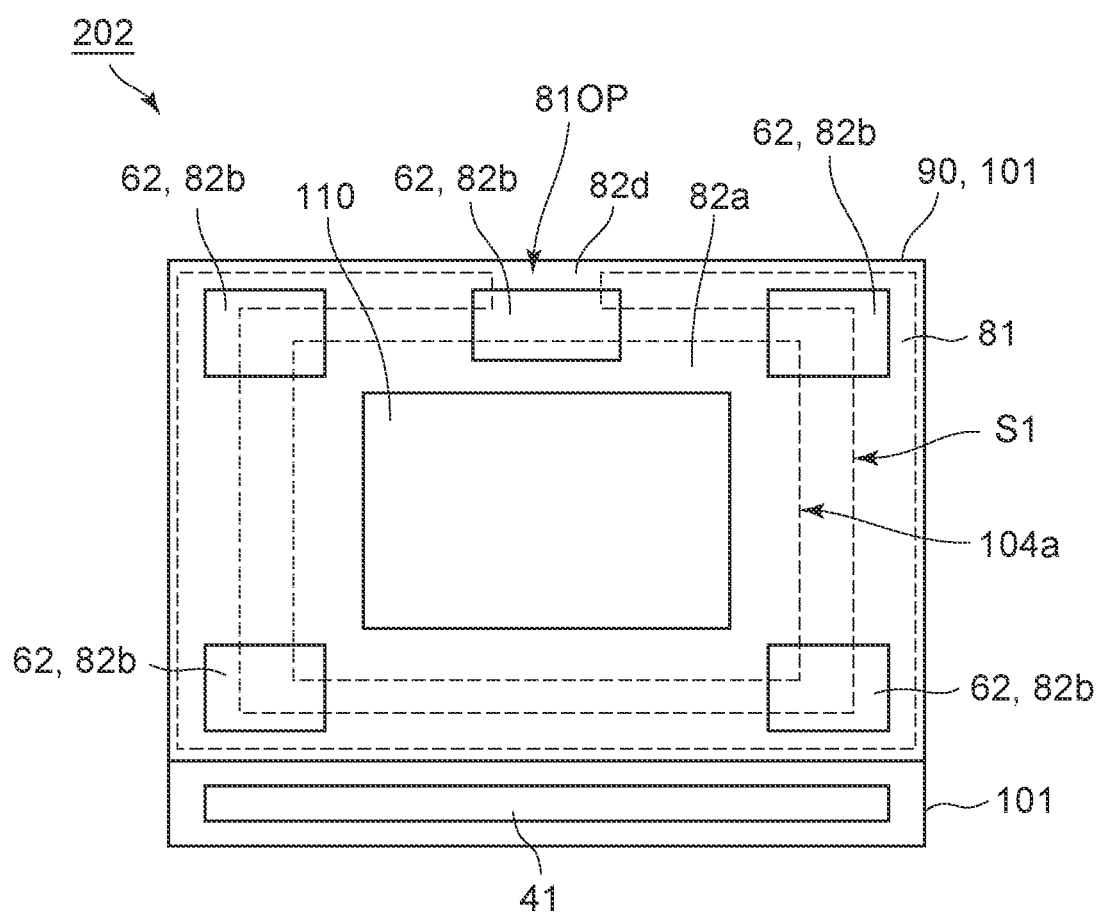
FIG. 7 is a schematic plan view of a semiconductor apparatus according to a third embodiment.

FIG. 7 is a schematic plan view of a semiconductor apparatus 202 according to a third embodiment. Hereinafter, the description of portions common to those of the second embodiment will not be repeated.

In the second embodiment, the frame-shaped low transmittance layer 6 is disposed so as to surround the effective pixel area 110 in plan view on one principal surface 102 of the substrate 101. On the other hand, in the present embodiment, as shown in FIG. 7, the low transmittance layer 6 is partially disposed. Specifically, four low transmittance layers 6 are disposed so as to cover four corners of the inner edge of the first bonding member 81 in plan view. The four low transmittance layers 6 may respectively cover the four corners of the color filter layer 104. In addition, one low transmittance layer 6 is disposed so as to cover a part of the opening part 81OP of the first bonding member 81, close to the effective pixel area 110, in plan view. Therefore, the second part 82b having a low cure ratio is formed under each of the five low transmittance layers 6.

In this way, in the present embodiment, the second parts 82b each having a low cure ratio are respectively disposed at parts that are respectively in contact with the corners of the first bonding member 81. In addition, the second part 82b having a low cure ratio is disposed at a part of the opening part 81OP, close to the effective pixel area 110. In the second bonding member 82, parts that are respectively in contact with the corners of the first bonding member 81 and a part disposed in the opening part 81OP are parts on which a stress tends to concentrate when the internal stress of the second bonding member 82 increases due to a temperature change or the like. In the present embodiment, the second parts 82b each having a low cure ratio and a low elasticity modulus are disposed at such parts. Thus, occurrence of a crack or a breakage is reduced in parts where a stress tends to concentrate and a crack or a breakage tends to occur. As a result, the bonding reliability of the translucent sheet 90 is improved.

Other Embodiments

Figure 8:
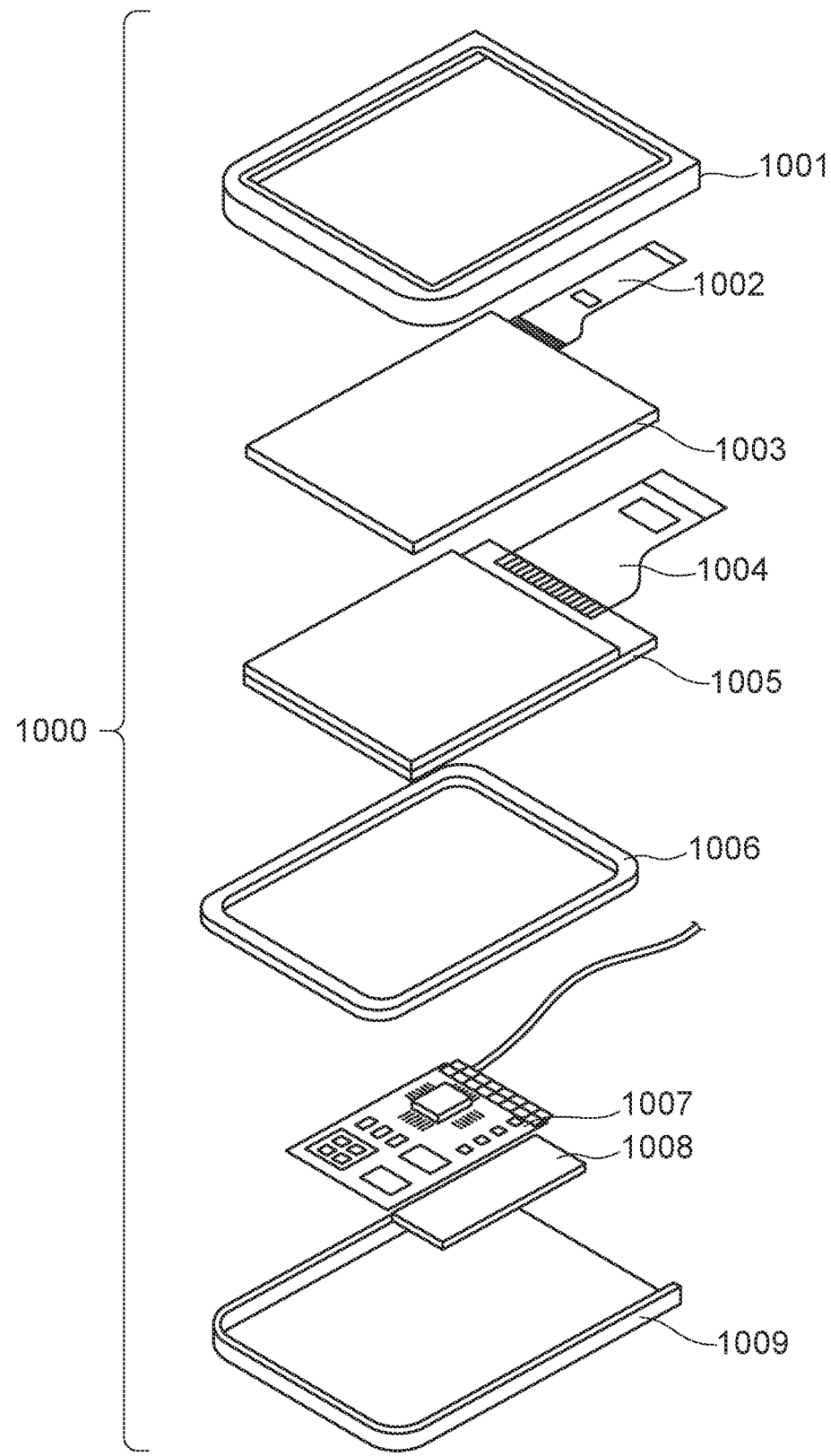
FIG. 8 is schematic diagram showing an example of a display apparatus.

FIG. 8 is a schematic view showing an example of a display apparatus 1000 according to the present embodiment. The display apparatus 1000 may include a touch panel 1003, a display panel 1005, a frame 1006, a circuit board 1007, and a battery 1008 between a top cover 1001 and a bottom cover 1009. For example, any one of the semiconductor apparatuses 200 to 202 according to the first to third embodiments may be used as the display panel 1005.

A flexible printed circuit (FPC) 1002 is connected to the touch panel 1003. A flexible printed circuit (FPC) 1004 is connected to the display panel 1005. Transistors are printed on the circuit board 1007. The battery 1008 does not need to be provided when the display apparatus 1000 is not a mobile device, and may be provided at another position even when the display apparatus 1000 is a mobile device.

The display apparatus 1000 according to the present embodiment may be used in a display unit of a photoelectric conversion apparatus including an optical unit having a plurality of lenses and an image pickup element that receives light having passed through the optical unit.

The photoelectric conversion apparatus may include a display unit that displays information acquired by the image pickup element. The photoelectric conversion apparatus may acquire information using information acquired by the image pickup element, and the display unit may display information different from that information. The display unit may be a display unit exposed to the outside of the photoelectric conversion apparatus or may be a display unit disposed in a viewfinder. The photoelectric conversion apparatus may be a digital camera or a digital camcorder.

Figure 9A:
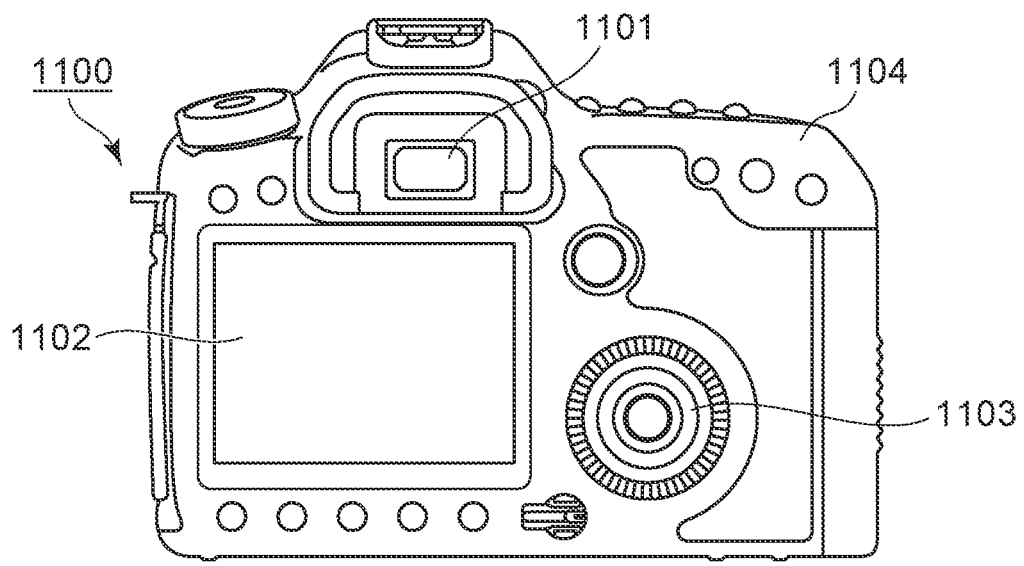
FIG. 9A is a schematic diagram showing an example of a photoelectric conversion apparatus.

FIG. 9A is a schematic view showing an example of the photoelectric conversion apparatus according to the present embodiment. The photoelectric conversion apparatus 1100 may include a viewfinder 1101, a back display 1102, an operation unit 1103, and a housing 1104. The viewfinder 1101 may include any one of the semiconductor apparatuses 200 to 202 according to the first to third embodiments. Alternatively, the viewfinder 1101 may be the display apparatus 1000 described in the present embodiment. In this case, the display apparatus is not limited to displaying only an image to be picked up and may display environmental information, an image pickup instruction, or the like. The environmental information may include the intensity of external light, the direction of external light, the moving speed of a subject, a possibility that a subject is shielded by a shielding material, or the like.

The photoelectric conversion apparatus 1100 includes an optical unit (not shown). The optical unit has a plurality of lenses and forms an image on the image pickup element accommodated in the housing 1104. The plurality of lenses is capable of adjusting a focal point by adjusting the relative positions of the lenses. This operation can be automatically performed.

The display apparatus according to the present embodiment may be used in a display unit of a mobile terminal. In this case, the display apparatus may have a display function and an operating function. The mobile terminal may be a cellular phone, such as a smartphone, a tablet, a head mounted display, or the like.

Figure 9B:
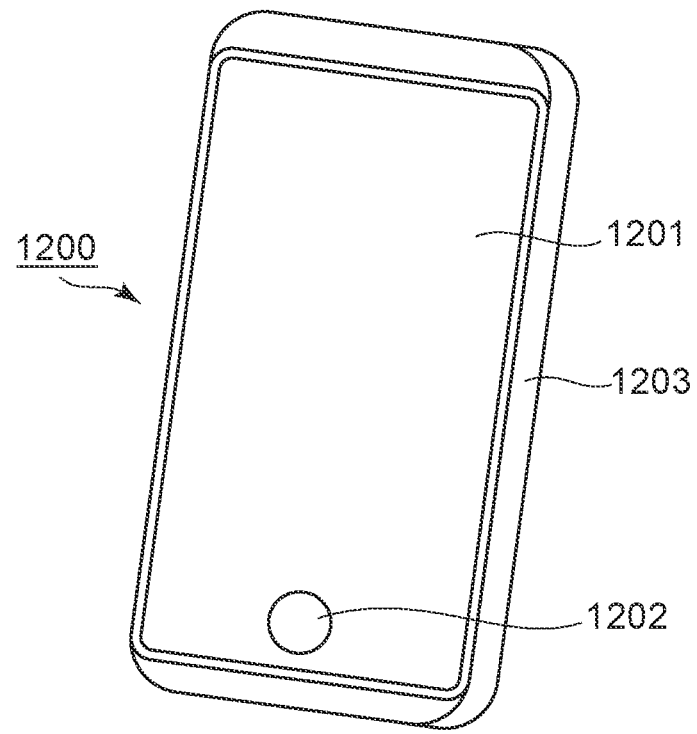
FIG. 9B is a schematic diagram showing an example of an electronic device.

FIG. 9B is a schematic view showing an example of an electronic device according to the present embodiment. An electronic device 1200 includes a display unit 1201, an operation unit 1202, and a housing 1203. The display unit 1201 may include any one of the semiconductor apparatuses 200 to 202 according to the first to third embodiments. The housing 1203 may contain a circuit, a printed circuit board having the circuit, a battery, and a communication unit. The operation unit 1202 may be a button or may be a touch panel-type response unit. The operation unit may be a biometric authentication unit that identifies a fingerprint to, for example, release a lock.

The electronic device including a communication unit may be regarded as a communication device.

Figure 10A:
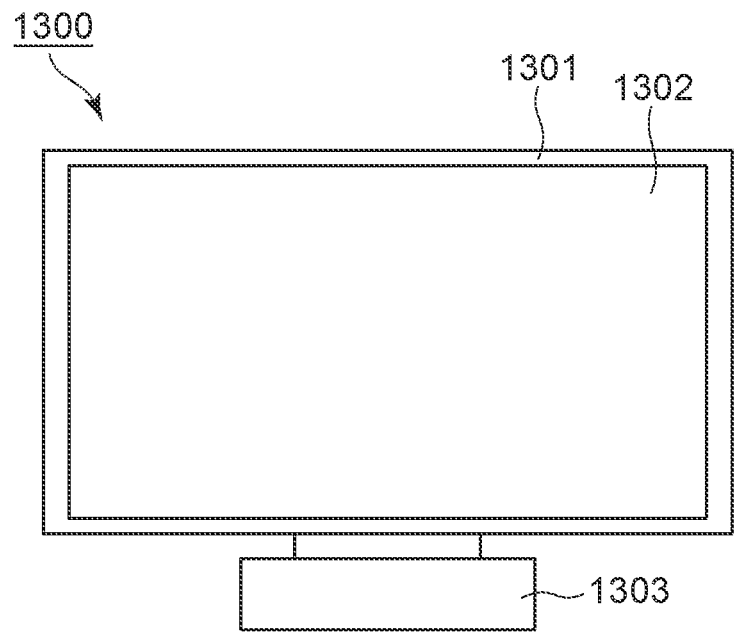
FIG. 10A is a schematic diagram showing an example of a display apparatus.
Figure 10B:
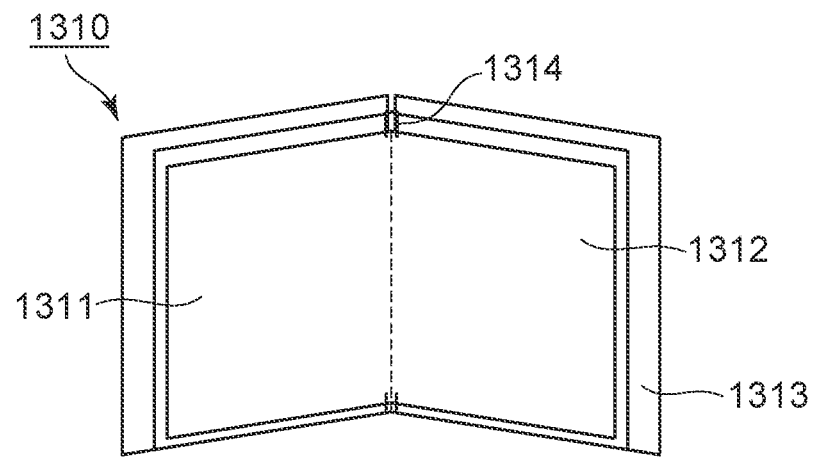
FIG. 10B is a schematic diagram showing an example of a foldable display apparatus.

FIGS. 10A and 10B are schematic views showing examples of a display apparatus according to the present embodiment. FIG. 10A is a display apparatus, such as a television monitor and a PC monitor. The display apparatus 1300 includes a frame 1301 and a display unit 1302. The display unit 1302 may include any one of the semiconductor apparatuses 200 to 202 according to the first to third embodiments.

The display apparatus 1300 includes a base 1303 that supports the frame 1301 and the display unit 1302. The base 1303 is not limited to the mode of FIG. 10A. The bottom side of the frame 1301 may serve as a base.

The frame 1301 and the display unit 1302 may be curved. The radius of curvature may be greater than or equal to 5000 mm and less than or equal to 6000 mm.

FIG. 10B is a schematic view showing another example of the display apparatus according to the present embodiment. A display apparatus 1310 of FIG. 10B is configured to be foldable, and is a so-called foldable display apparatus. The display apparatus 1310 includes a first display unit 1311, a second display unit 1312, a housing 1313, and a folding point 1314. Each of the first display unit 1311 and the second display unit 1312 may include any one of the semiconductor apparatuses 200 to 202 according to the first to third embodiments.

The first display unit 1311 and the second display unit 1312 may make up a seamless one-sheet display apparatus. The first display unit 1311 and the second display unit 1312 may be separated at the folding point 1314.

The first display unit 1311 and the second display unit 1312 may respectively display different images or the first and second display units 1311, 1312 may display one image.

Figure 11A:
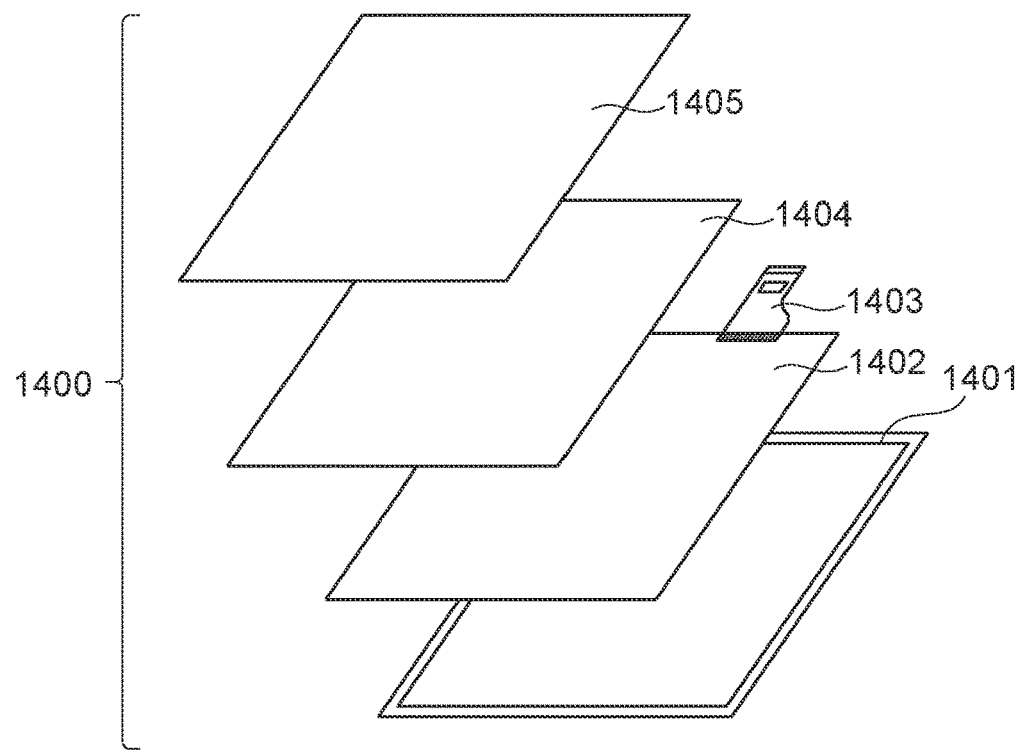
FIG. 11A is a schematic diagram showing an example of an illumination apparatus.

FIG. 11A is a schematic view showing an example of an illumination apparatus according to the present embodiment. The illumination apparatus 1400 may include a housing 1401, a light source 1402, a circuit board 1403, an optical film 1404, and a light diffusion unit 1405. The light source 1402 may include any one of the semiconductor apparatuses 200 to 202 according to the first to third embodiments. The optical film 1404 may be a filter that improves the color rendering property of the light source 1402. The light diffusion unit 1405 is capable of effectively diffusing light from the light source for illumination or the like to bring light to a wide range. The optical film 1404 and the light diffusion unit 1405 may be provided on a light emission side of illumination. Where necessary, a cover may be provided at an outermost part.

The illumination apparatus is an apparatus that illuminates, for example, a room. The illumination apparatus may emit light in any one of white color, daylight color, and other colors from blue to red. The illumination apparatus may include a light modulating circuit that modulates light of any one of those colors.

The illumination apparatus may include any one of the semiconductor apparatuses 200 to 202 according to the first to third embodiments, and a power supply circuit connected thereto. The power supply circuit is a circuit that converts alternating current voltage to direct current voltage. White has a color temperature of 4200K, and daylight color has a color temperature of 5000K. The illumination apparatus may include a color filter.

The illumination apparatus according to the present embodiment may include a heat radiation portion. The heat radiation portion is to release heat inside the apparatus to the outside of the apparatus and may be made of a metal having a high specific heat, liquid silicon, or the like.

Figure 11B:
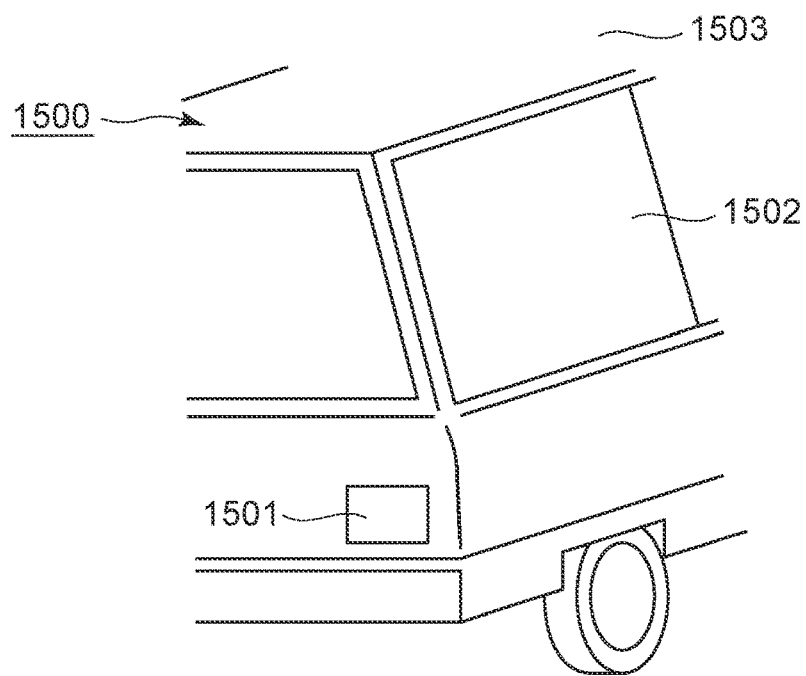
FIG. 11B is a schematic diagram showing an example of an automobile equipped with a vehicle lamp.

FIG. 11B is a schematic view of an automobile that is an example of a moving object according to the present embodiment. The automobile includes a tail lamp that is an example of a lamp. The automobile 1500 includes the tail lamp 1501 and may be configured to, when brake operation or the like is performed, turn on the tail lamp 1501.

The tail lamp 1501 may include any one of the semiconductor apparatuses 200 to 202 according to the first to third embodiments. The tail lamp 1501 may include a protective member that protects a light-emitting element. The protective member may be made of any material as long as the protective member has a high strength to a certain extent and can be made of polycarbonate or the like. A furan dicarboxylic acid derivative, an acrylonitrile derivative, or the like may be mixed with polycarbonate.

The automobile 1500 may include a body 1503 and windows 1502 fixed to the body 1503. The windows 1502 other than windows for viewing the front and rear of the automobile 1500 each may be a transparent display. The transparent display may include any one of the semiconductor apparatuses 200 to 202 according to the first to third embodiments. In this case, the component materials of the electrodes and the like of a semiconductor apparatus 600 are made up of transparent members.

The moving object according to the present embodiment may be a ship, an airplane, a drone, or the like. The moving object may include a body and a lamp provided on the body. The lamp may emit light for informing a position of the body. The lamp may include any one of the semiconductor apparatuses 200 to 202 according to the first to third embodiments.

Application examples of the display apparatus of each of the above-described embodiments will be described with reference to FIGS. 12A and 12B. The display apparatus is applicable to a wearable system as a wearable device, such as smartglasses, an HMD, and a smart contact lens. An image pickup and display apparatus used in such application examples includes an image pickup apparatus capable of performing photoelectric conversion of visible light and a display apparatus capable of emitting visible light.

Figure 12A:
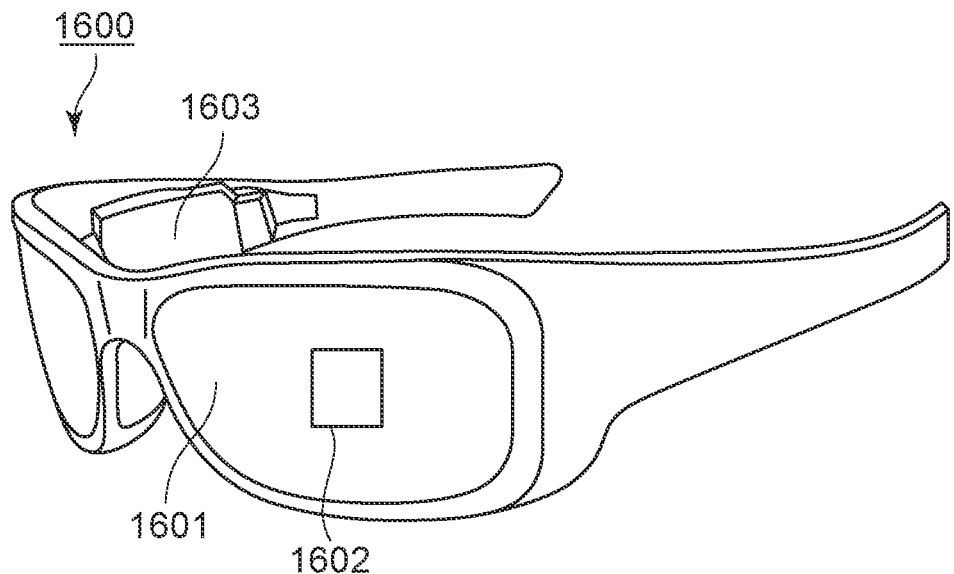
FIG. 12A is a schematic diagram showing an example of a wearable device.

FIG. 12A illustrates glasses 1600 (smartglasses) according to one application example. An image pickup apparatus 1602, such as a CMOS sensor and an SPAD, is provided on the surface side of a lens 1601 of the glasses 1600. A display apparatus is provided on the back surface side of the lens 1601, and the display apparatus may include any one of the semiconductor apparatuses 200 to 202 according to the first to third embodiments.

The glasses 1600 further include a controller 1603. The controller 1603 functions as a power supply to supply electric power to the image pickup apparatus 1602 and the display apparatus of any one of the embodiments. The controller 1603 controls the operations of the image pickup apparatus 1602 and the display apparatus. An optical system for gathering light to the image pickup apparatus 1602 is formed in the lens 1601.

Figure 12B:
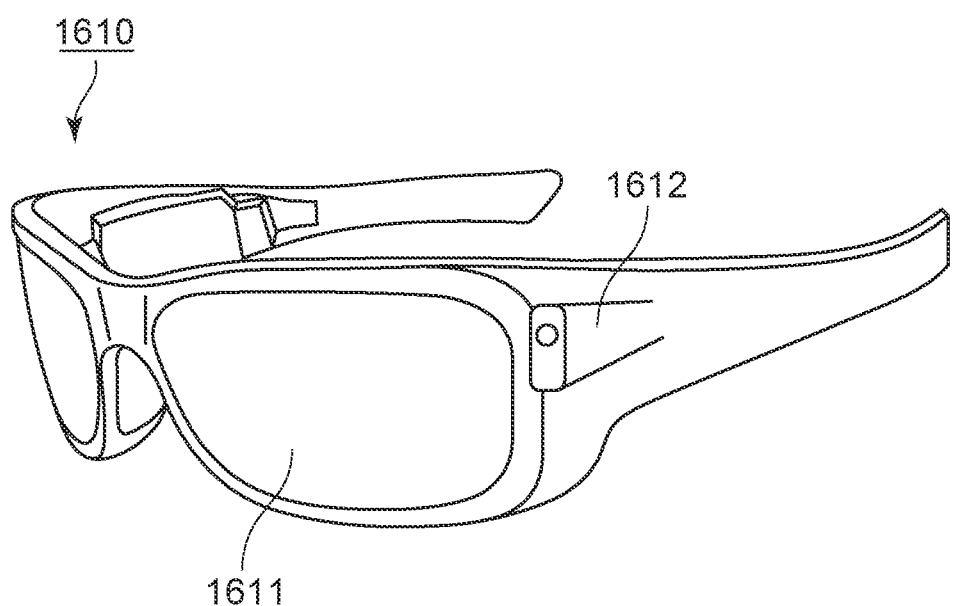
FIG. 12B is a schematic diagram showing an example of a mode in which a wearable device is equipped with an image pickup apparatus.

FIG. 12B illustrates glasses 1610 (smartglasses) according to one application example. The glasses 1610 include a controller 1612, and an image pickup apparatus corresponding to the image pickup apparatus 1602, and the display apparatus are installed in the controller 1612. The display apparatus may include any one of the semiconductor apparatuses 200 to 202 according to the first to third embodiments. The image pickup apparatus in the controller 1612 and an optical system for projecting light emitted from a display apparatus are formed in a lens 1611, and an image is projected onto the lens 1611. The controller 1612 functions as a power supply to supply electric power to the image pickup apparatus and the display apparatus and also controls the operations of the image pickup apparatus and the display apparatus.

The controller may include a line-of-sight detection unit that detects the line of sight of a wearer. Infrared radiation may be used to detect the line of sight. An infrared emitting unit emits infrared light to the eye of a user gazing at a display image. Infrared light emitted and reflected from the eye is detected by an image pickup unit including a light receiving element. Thus, a picked-up image of the eye is obtained. A reducer that reduces light from the infrared emitting unit to the display unit in plan view is provided, so a decrease in image quality is reduced.

The line-of-sight of the user toward the display image is detected from the picked-up image of the eye, obtained through image pickup using infrared light. A selected known technique may be applied to line-of-sight detection using a picked-up image of an eye. As an example, a line-of-sight detection method based on a Purkinje image caused by reflection of irradiation light on a cornea may be used.

More specifically, a line-of-sight detection process based on a pupil-cornea reflection method is performed. A line-of-sight vector indicating the orientation (rotational angle) of the eye is calculated in accordance with the pupil image contained in a picked-up image of the eye and a Purkinje image by using the pupil-cornea reflection method. Thus, the line of sight of a user is detected.

A display apparatus according to an embodiment of the present invention may include an image pickup apparatus having a light receiving element and may control a display image of the display apparatus in accordance with information about the line of sight of a user from the image pickup apparatus.

Specifically, the display apparatus determines a first field of view area at which the user gazes and a second field of view area other than the first field of view area in accordance with line-of-sight information. A first field of view area and a second field of view area may be determined by the controller of the display apparatus or a first field of view area and a second field of view area determined by an external controller may be received. In a display area of the display apparatus, a display resolution of the first field of view area may be controlled so as to be higher than a display resolution of the second field of view area. In other words, the resolution of the second field of view area may be made lower than the resolution of the first field of view area.

A display area includes a first display area and a second display area different from the first display area, and an area having a higher priority is determined in accordance with line-of-sight information from among the first display area and the second display area. A first field of view area and a second field of view area may be determined by the controller of the display apparatus or a first field of view area and a second field of view area determined by an external controller may be received. The resolution of an area having a higher priority may be controlled so as to be higher than the resolution of an area other than the area having a higher priority. In other words, the resolution of an area having a relatively lower priority may be decreased.

AI may be used to determine a first field of view area or an area having a higher priority. AI may be a model configured to estimate an angle of a line of sight and a distance to an object ahead of the line of sight from an image of an eye by using the images of the eye and corresponding directions in which the eye of the image is actually viewing as training data. The display apparatus, or the image pickup apparatus, or an external apparatus may include an AI program. When the external apparatus includes an AI program, the AI program is transmitted to the display apparatus via communication.

When display control is performed in accordance with line-of-sight detection, it is suitably applied to smartglasses further including an image pickup apparatus that picks up an outside image. The smartglasses are capable of displaying picked-up outside information in real time.

According to the present invention, the bonding reliability of the translucent sheet is improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-058490, filed Mar. 30, 2021, which is hereby incorporated by reference herein in its entirety.

What is claimed is:

1. A semiconductor apparatus comprising:
a semiconductor device having an effective pixel area with a plurality of effective pixels and a peripheral area around the effective pixel area;
a translucent sheet overlapping the effective pixel area and the peripheral area in a plan view on a principal surface of the semiconductor device;
a first bonding member disposed between the peripheral area and the translucent sheet to bond the semiconductor device with the translucent sheet; and
a second bonding member disposed between the effective pixel area and the translucent sheet to bond the semiconductor device with the translucent sheet, wherein the first bonding member and the second bonding member are in contact with each other via a first interface, wherein
the semiconductor device includes an optical member in the effective pixel area on a side with the translucent sheet,
an edge of the optical member is disposed in the peripheral area,
the second bonding member is made of resin,
the second bonding member includes a first part, and a second part disposed between the first part and the first bonding member and in contact with the first bonding member via the first interface, and
a cure ratio of the second part is lower than a cure ratio of the first part.

2. The semiconductor apparatus according to claim 1, wherein the first interface overlaps the peripheral area in the plan view on the principal surface of the semiconductor device.

3. The semiconductor apparatus according to claim 1, wherein the first bonding member is made of resin.

4. The semiconductor apparatus according to claim 3, wherein the first bonding member is made of a first resin, and the second bonding member is made of a second resin different from the first resin.

5. The semiconductor apparatus according to claim 1, wherein
the first bonding member has a polygonal frame shape with a plurality of corners in the plan view on the principal surface of the semiconductor device, and
the second part is in contact with at least one of the plurality of corners of the first bonding member.

6. The semiconductor apparatus according to claim 5, wherein
the first bonding member has a rectangular frame shape with four corners in the plan view on the principal surface of the semiconductor device, and
the second part is in contact with the four corners of the first bonding member.

7. The semiconductor apparatus according to claim 1, wherein
the second part covers the edge of the optical member.

8. The semiconductor apparatus according to claim 1, wherein the optical member includes a color filter layer.

9. The semiconductor apparatus according to claim 1, wherein the optical member includes a microlens array layer.

10. The semiconductor apparatus according to claim 1, wherein
the first bonding member has a frame shape with an opening in the plan view on the principal surface of the semiconductor device,
the second bonding member has a third part disposed in the opening, and
a cure ratio of the third part is lower than the cure ratio of the first part.

11. The semiconductor apparatus according to claim 1, wherein
the translucent sheet has a first area and a second area, the second area has a transmittance of light with a wavelength of 365 nm lower than a transmittance of the first area,
the first area overlaps the effective pixel area in the plan view on the principal surface of the semiconductor device, and
the second area overlaps the first interface in the plan view on the principal surface of the semiconductor device.

12. The semiconductor apparatus according to claim 11, wherein the second area surrounds the effective pixel area in the plan view on the principal surface of the semiconductor device.

13. The semiconductor apparatus according to claim 1, wherein the second part surrounds the first part in the plan view on the principal surface of the semiconductor device.

14. A display apparatus comprising the semiconductor apparatus according to claim 1, wherein
at least one of the plurality of effective pixels includes an organic light emitting element and a transistor connected to the organic light emitting element.

15. A photoelectric conversion apparatus comprising:
an optical unit having a plurality of lenses;
an image pickup element arranged to receive light having passed through the optical unit; and
a display unit arranged to display an image picked up by the image pickup element, wherein
the display unit includes the semiconductor apparatus according to claim 1, and
at least one of the plurality of effective pixels includes an organic light emitting element.

16. An electronic device comprising:
a display unit including the semiconductor apparatus according to claim 1;
a housing on which the display unit is provided; and
a communication unit provided in the housing and arranged to communicate with an external source, wherein
at least one of the plurality of effective pixels includes an organic light emitting element.

17. An illumination apparatus comprising:
a light source including the semiconductor apparatus according to claim 1; and
a light diffusion unit or an optical film arranged to transmit light emitted from the light source, and
at least one of the plurality of effective pixels includes an organic light emitting element.

18. A moving object comprising:
a lamp including the semiconductor apparatus according to claim 1; and
a body in which the lamp is provided, wherein
at least one of the plurality of effective pixels includes an organic light emitting element.

19. A semiconductor apparatus comprising:
a semiconductor device having an effective pixel area with a plurality of effective pixels and a peripheral area around the effective pixel area;
a translucent sheet overlapping the effective pixel area and the peripheral area in a plan view on a principal surface of the semiconductor device;
a first bonding member disposed between the peripheral area and the translucent sheet to bond the semiconductor device with the translucent sheet; and
a second bonding member disposed between the effective pixel area and the translucent sheet to bond the semiconductor device with the translucent sheet, wherein the first bonding member and the second bonding member are in contact with each other via a first interface, wherein
the second bonding member is made of resin,
the second bonding member includes a first part, and a second part disposed between the first part and the first bonding member and in contact with the first bonding member via the first interface,
a cure ratio of the second part is lower than a cure ratio of the first part,
the first bonding member has a frame shape with an opening in the plan view,
the second bonding member has a third part disposed in the opening,
a cure ratio of the third part is lower than the cure ratio of the first part.

* * * * *